US006966011B2

(12) United States Patent
Tanaka et al.

(10) Patent No.: US 6,966,011 B2
(45) Date of Patent: *Nov. 15, 2005

(54) DATA RECONSTRUCTION METHOD AND SYSTEM WHEREIN TIMING OF DATA OF DATA RECONSTRUCTION IS CONTROLLED IN ACCORDANCE WITH CONDITIONS WHEN A FAILURE OCCURS

(75) Inventors: Atsushi Tanaka, Kokubunji (JP); Yoshihisa Kamo, Musashimurayama (JP); Hitoshi Kakuta, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 95 days.

This patent is subject to a terminal disclaimer.

(21) Appl. No.: 10/610,759

(22) Filed: Jul. 2, 2003

(65) Prior Publication Data

US 2004/0153730 A1 Aug. 5, 2004

Related U.S. Application Data

(63) Continuation of application No. 09/712,171, filed on Nov. 15, 2000, now Pat. No. 6,625,748, which is a continuation of application No. 09/162,444, filed on Sep. 29, 1998, now Pat. No. 6,161,194, which is a continuation of application No. 08/895,886, filed on Jul. 17, 1997, now Pat. No. 5,941,993, which is a continuation of application No. 08/534,841, filed on Sep. 27, 1995, now Pat. No. 5,889,938, which is a continuation of application No. 07/859,850, filed on Mar. 30, 1992, now Pat. No. 5,495,572.

(30) Foreign Application Priority Data

Apr. 1, 1991 (JP) .............................. 3-094728

(51) Int. Cl.[7] ............................... G06F 11/08

(52) U.S. Cl. ........................................ 714/6

(58) Field of Search ............. 714/6, 7, 25, 47, 714/2, 9, 710, 711; 711/114

(56) References Cited

U.S. PATENT DOCUMENTS

| 4,053,752 A | 10/1977 | DeJohn et al. |
| 4,358,848 A | 11/1982 | Patel |
| 4,464,747 A | 8/1984 | Groudan et al. .............. 371/50 |
| 4,870,643 A | 9/1989 | Bultman et al. |
| 4,914,656 A | 4/1990 | Dunphy, Jr. et al. |

(Continued)

FOREIGN PATENT DOCUMENTS

| EP | 0541992 | 5/1993 |
| EP | 0546826 | 6/1993 |
| EP | 0831484 | 3/1998 |
| JP | 61259334 | 11/1986 |
| JP | 6390074 | 4/1988 |

(Continued)

OTHER PUBLICATIONS

R. Attar et al., "Sita Initialization, Recovery, and Backup in a Distributed Database System", *IEEE Trans. on Software Engineering*, vol. SE–10, No. 6, Nov. 1984, pp. 645–649.

(Continued)

*Primary Examiner*—Scott Baderman
(74) *Attorney, Agent, or Firm*—Mattingly, Stanger, Malur & Brundidge, P.C.

(57) ABSTRACT

A data storage system connectable to a host unit which issues data read/write requests to the data storage system, and which includes a plurality of disc units, and a controller connected to the disc units. A fault can occur in any of the disc units. The disc units store data in a plurality of data groups and error correcting data corresponding to each of the data groups. The controller, operable in different modes, performs processing of reconstructing data stored in any of the disc units in which a fault has occurred based on all other data belonging to any of the data groups to which the data to be reconstructed belongs and error correcting data corresponding to any of the data groups to which the data to be reconstructed belongs, and performs processing of data read/write requests from the host unit.

6 Claims, 7 Drawing Sheets

U.S. PATENT DOCUMENTS

| | | | |
|---|---|---|---|
| 4,942,579 A | 7/1990 | Goodlander et al. | 371/51 |
| 4,958,351 A | 9/1990 | Flora et al. | |
| 5,208,813 A | 5/1993 | Stallmo | |
| 5,233,618 A | 8/1993 | Glider et al. | 371/68.1 |
| 5,274,799 A | 12/1993 | Brant et al. | |
| 5,321,703 A | 6/1994 | Weng | 371/36 |
| 5,390,187 A | 2/1995 | Stallmo | |
| 5,495,572 A | 2/1996 | Tanaka et al. | 395/184.01 |
| 5,522,031 A | 5/1996 | Ellis et al. | 395/182.04 |
| 5,564,116 A | 10/1996 | Arai et al. | 395/182.05 |
| 5,649,093 A | 7/1997 | Hanko et al. | 395/182.04 |
| 5,889,938 A | 3/1999 | Tanaka et al. | 714/6 |
| 5,941,993 A | 8/1999 | Tanaka et al. | 714/6 |
| 6,000,039 A | 12/1999 | Tanaka et al. | 714/6 |

FOREIGN PATENT DOCUMENTS

| | | |
|---|---|---|
| JP | 63155468 | 6/1988 |
| JP | 1250128 | 10/1989 |
| JP | 2135555 | 5/1990 |
| JP | 52516 | 1/1993 |

OTHER PUBLICATIONS

G. Copeland et al., "A Comparison of High–Availability Media Recovery Techniques", *Proc. SIGMOD 1989*, ACM, pp. 98–109.

G. Copeland et al., "A Comparison of High–Availability Media Recovery Techniques", *Proceedings of the 1989 ACM SIGMOD International Conference on Management of Data*, Portland, Oregon, May 31–Jun. 2, 1989, pp. 98–109, ACM Press, NY, ISBN 0–89791–317–5, see als *SIGMOD Record*, vol. 18, No. 2, Jun. 1980, pp. 98–109, ACM Press, NY, ISSN 0163–5808.

W. Meador, "Disk Array Systems", *Digest of Papers, Compcon '89: Thirty–Fourth IEEE Computer Society International Conference*, Feb. 27, 1989, San Francisco, CA, pp. 143–146, IEEE, Piscataway, NJ ISBN 0–8186–1909–0.

T. Olson, "Disk Array Performance in a Random IO Environment", *ACM SIGARCH Computer Architecture News*, vol. 17, No. 5, Sep. 1989, pp. 71–77, ACM Press, New York, NY, ISSN 0163–5964.

P. Chen et al., "Maximizing Performance In a Striped Disk Array", *Proceedings of The 17th Annual International Symposium on Computer Architecture*, May 28–31, 1990, Seattle, WA, pp. 322–331, IEEE Computer Society Press, Los Alamitos, CA.

G. Gibson et al., "Failure Correction Techniques for Large Disk Arrays", *Proceedings of the Third International Conference on Architectural Support for Programming Languages and Operation Systems (ASPLOS–III)*, Apr. 3–6, 1989, Boston, MA, pp. 123–132, ACM Press, New York, NY, ISBN 0–89791–300–0.

A. Reddy et al., "Gracefully Degradable Disk Arrays", *Proceedings of the 1991 International Symposium on Fault–Tolerant Computing(FTCS 1991)*, Jun. 25–27, 1991, Montreal, Canada, pp. 401–408.

R. Katz et al. "Disk System Architectures for High Performance Computing", *Proceedings of the IEEE*, vol. 77, No. 12, DEC. 1989, pp. 1842–1858.

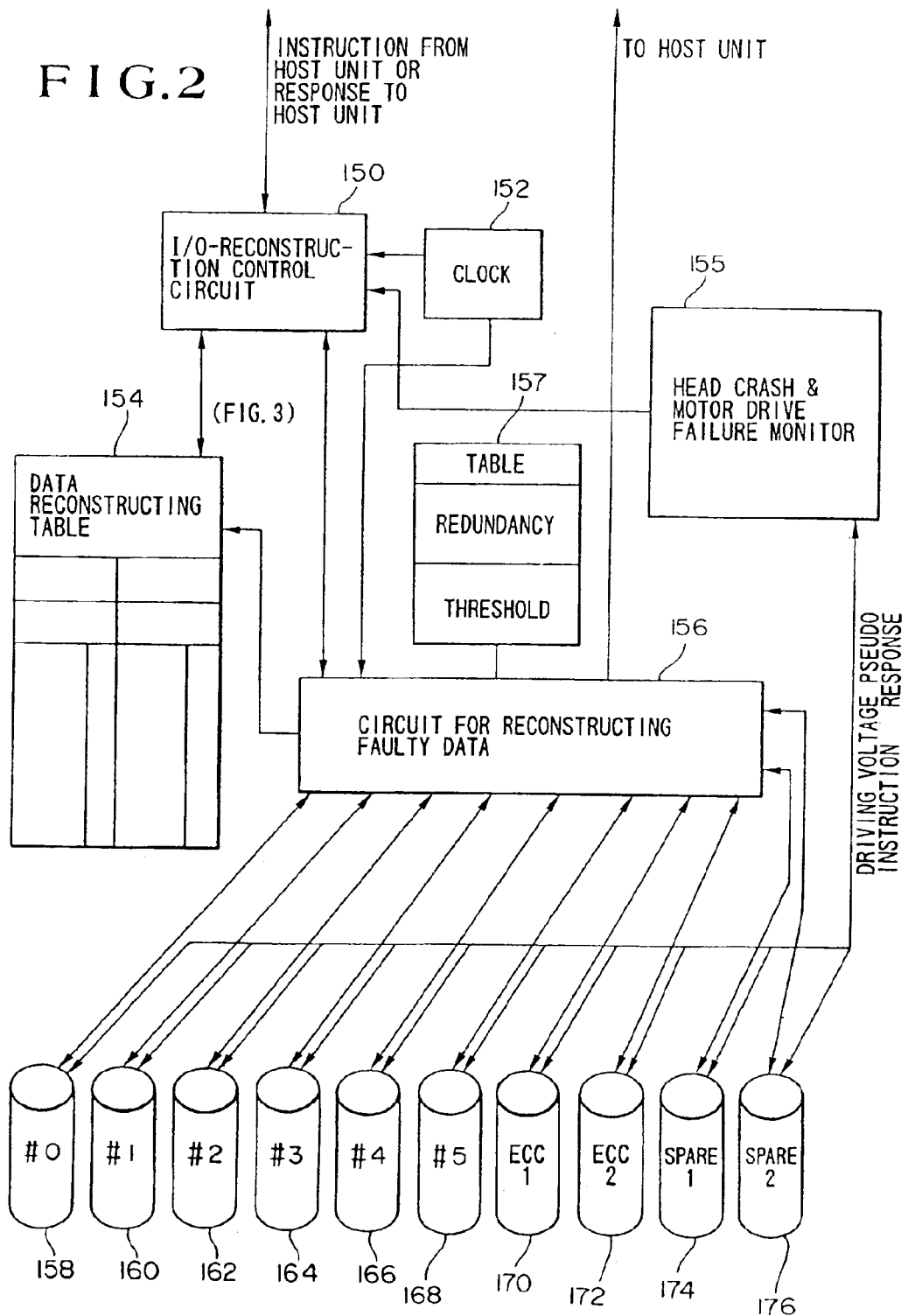

| DATA RECONSTRUCTING TABLE | | | |
|---|---|---|---|
| SPARE STORAGE UNIT SPARE 1 | | SPARE STORAGE UNIT SPARE 2 | |
| STORAGE UNIT AT FAILURE #2 | | STORAGE UNIT AT FAILURE #4 | |
| POINT OF FAILURE | | POINT OF FAILURE | |
| FAILURE SECTOR OR ADDRESS | RECONSTRUCTION JUDGEMENT FLAG | FAILURE SECTOR OR ADDRESS | RECONSTRUCTION JUDGEMENT FLAG |
| 0000 | 1 | 0000 | 1 |
| 0001 | 1 | 0001 | 1 |
| 0010 | 1 | 0010 | 0 |
| ⋮ | ⋮ | ⋮ | ⋮ |
| FFFF | 0 | FFFF | 0 |

1 — SPARE STORAGE UNIT SPARE 1
2 — STORAGE UNIT AT FAILURE #2
3 — POINT OF FAILURE
4 — FAILURE SECTOR OR ADDRESS
5 — RECONSTRUCTION JUDGEMENT FLAG

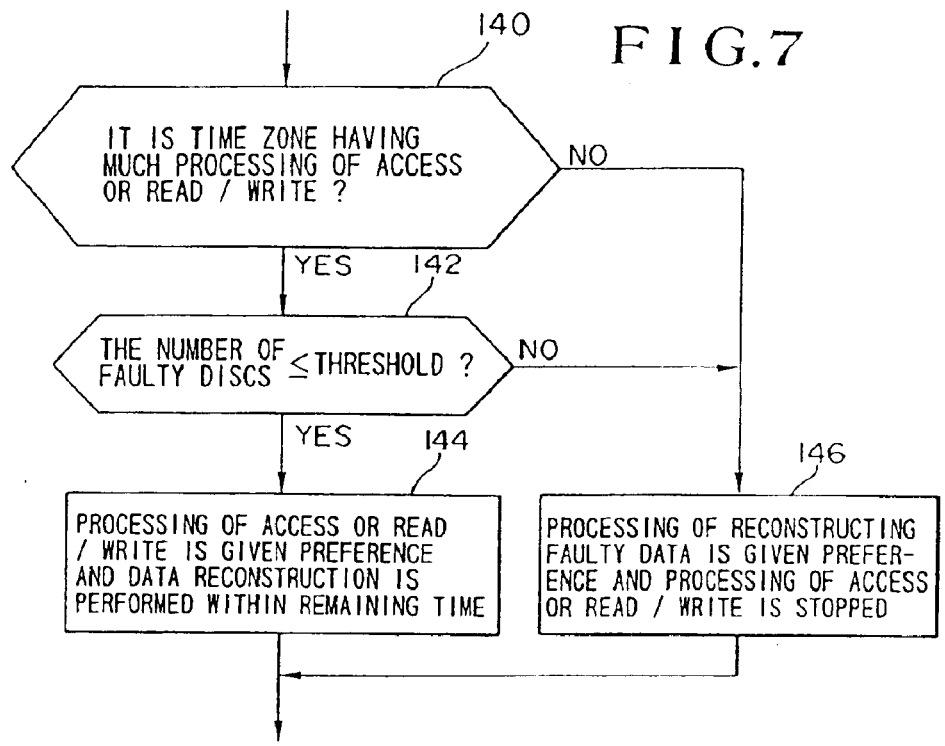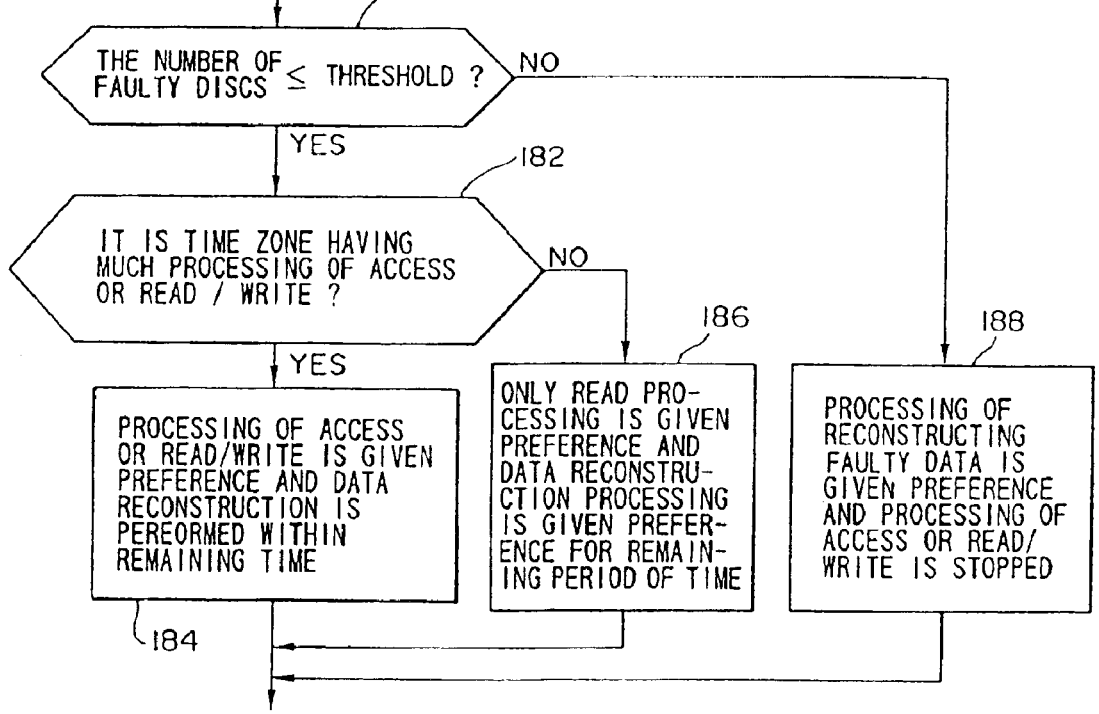

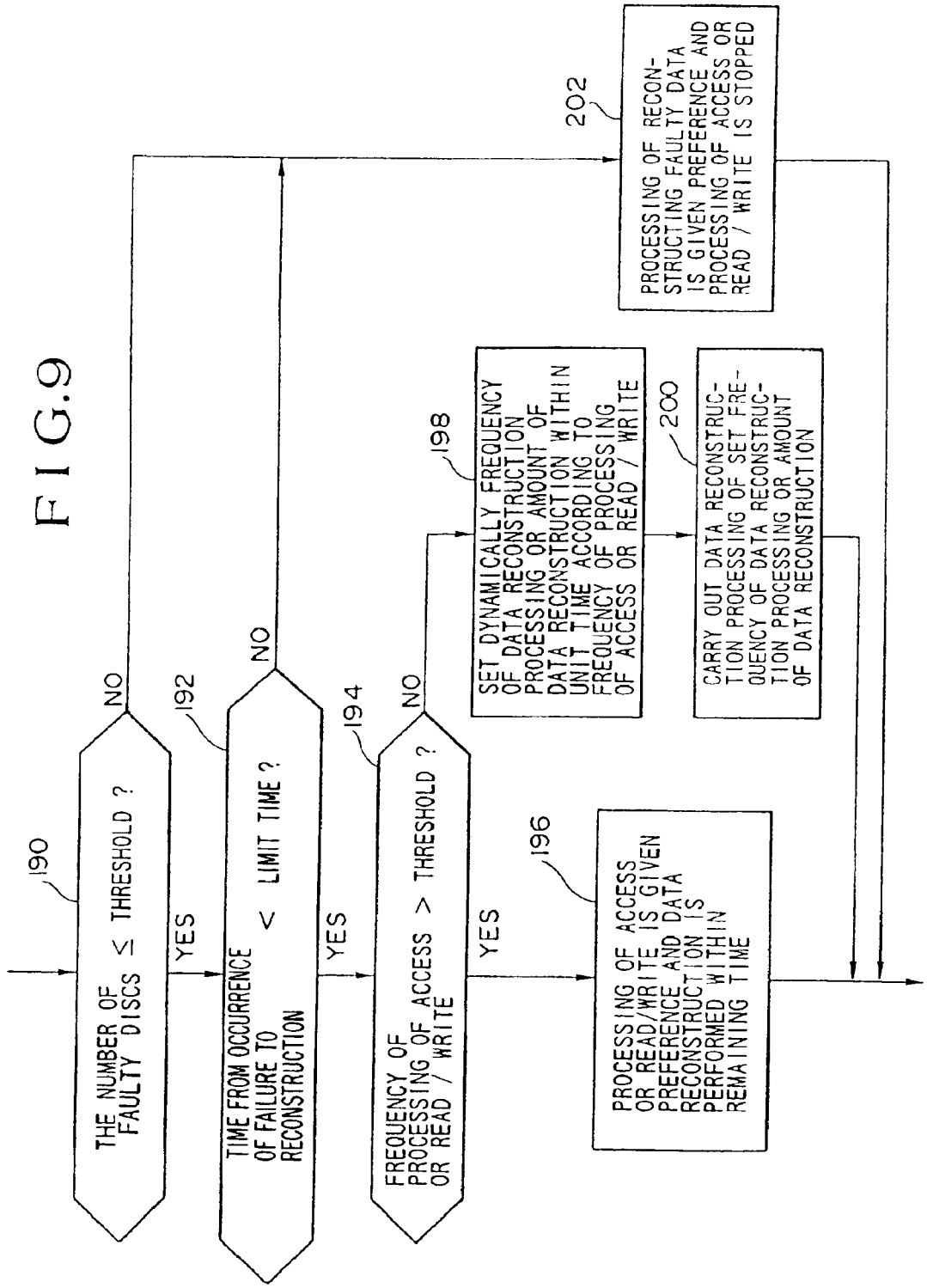

DATA RECONSTRUCTION METHOD AND SYSTEM WHEREIN TIMING OF DATA OF DATA RECONSTRUCTION IS CONTROLLED IN ACCORDANCE WITH CONDITIONS WHEN A FAILURE OCCURS

CROSS-REFERENCES TO RELATED APPLICATIONS

This present application is a continuation of application Ser. No. 09/712,171, filed Nov. 15, 2000 now U.S. Pat. No. 6,625,748; which is a continuation of application Ser. No. 09/162,444, filed Sep. 29, 1998, now U.S. Pat. No. 6,161,194; which is a continuation of Ser. No. 08/895,886 filed on Jul. 17, 1997, now U.S. Pat. No. 5,941,993; which is a continuation of application Ser. No. 08/534,841, filed Sep. 27, 1995, now U.S. Pat. No. 5,889,938; which is a continuation of application Ser. No. 07/859,850, filed Mar. 30, 1992, now U.S. Pat. No. 5,495,572, the contents of which are incorporated herein by reference.

BACKGROUND OF THE INVENTION

The present invention relates to a memory for performing access or read/write in parallel with a plurality of independent storage units as a set, and more particularly to a data reconstruction system and a method used therein which are available in occurrence of a failure.

The technology for controlling discs arranged in parallel is disclosed in Japanese Kokai 1-250128 corresponding to U.S. patent application Ser. No. 07/118,785 filed on Nov. 6, 1987, now U.S. Pat. No. 4,870,643, and Japanese Kokai 2-135555.

As for the technology for achieving the large capacity of a memory and the high speed transfer of data, there is known a method in which the data is divided into a plurality of data of bit units, byte units or arbitrary units, with a plurality of storage units as a set, to be stored in the respective storage units, and when the data is to be read out, the plurality of data is simultaneously read out from the respective storage units. Moreover, in this method, the data to be used for a parity check is produced from the data divided among the storage units to be stored in another storage unit. When the failure occurs in any of the storage units, the data stored in the remaining normal storage units and the data for the parity check are used to reconstruct the faulty data, thereby to improve the reliability of the memory.

Further, there is known the technology in which when the failure occurs in any of the storage units, not only the data is reconstructed for the normal read operation, but also the data stored in the storage unit at fault is reconstructed to be stored in the normal storage unit which is additionally provided. With this technology, the reconstructed data is stored in the spare storage unit and the data is read out from the spare storage unit for the subsequent access, whereby it is possible to improve the availability of the memory.

The failure of a certain number of storage units can be repaired by providing the parity data, and the data can also be reconstructed by the provision of the spare storage unit. However, for the operation of repairing the failure, it is necessary to read out all of the data stored in the normal storage units and the data for the parity check, reconstruct the faulty data and write the reconstructed data to the spare storage unit. Therefore, during the repair of the failure, the storage units are occupied so that the request to process the normal access or read/write which is issued from a host unit continues to wait. This results in the degradation of the performance of the memory. As for the error check method for reconstructing the faulty data, there are known the parity data, Reed-Solomon code and error check code (ECC) methods.

Although the redundancy is provided for the failure of a plurality of storage units, the failure repair in the failure of one storage unit and that in the failure of a plurality of storage units are managed without taking the distinction therebetween into consideration. Therefore, putting emphasis on the repair of the failure, since the processing of the normal access or read/write cannot be performed in spite of the failure of one storage unit, there arises a problem in that the efficiency of the processing of the normal access or read/write is reduced. On the other hand, putting emphasis on the normal access or read/write operation, there arises a problem in that the time required for the repair of the failure is not secure during the failure of a plurality of storage units, and as a result, the possibility that the whole system may break down will be increased.

SUMMARY OF THE INVENTION

It is therefore an object of the present invention to minimize the reduction of the processing of the normal access or read/write in the failure, limit the time required for the repair of the failure within a fixed period of time, and ensure the high reliability, with respect to a memory which has the redundancy for the failure of two or more storage units.

It is another object of the present invention to provide a data reconstruction system which is capable of selecting a suitable data reconstruction method in correspondence to the various kinds of conditions relating to the repair of the failure and carrying out the most suitable data reconstruction processing.

It is still another object of the present invention to provide a control system which is capable of changing the procedure of data reconstruction processing in correspondence to the change of redundancy relating to the number of ECC discs included in a plurality of storage units which are arranged in parallel to one another.

The above objects of the present invention are attained by the provision of a memory including a group of storage units for dividing data into a plurality of data of bit units, byte units or arbitrary units to store therein the divided data, the plurality of independent storage units forming a set; discs for storing therein ECC data corresponding to the divided data; a spare storage unit for storing therein the reconstructed data; an I/O-reconstruction control circuit for receiving a command relating to an I/O operation issued from a host unit to execute processing in accordance with the command or respond to the host unit; a timer for giving the point of failure, an elapsed time during the data reconstruction, a unit time and the like; a data reconstructing table for the storage unit at fault; and a faulty data reconstructing circuit for performing discovery of the faulty data, data reconstruction and an operation of writing data to a spare storage disc, wherein when a failure occurs in any of the storage units, the faulty data reconstructing circuit detects the failure by an error check to inform the I/O-reconstruction control circuit of the failure, and the I/O-reconstruction control circuit discriminates a state of the failure to select the preferred processing suitable for the state of the failure out of the processing of the normal access or read/write and the data reconstruction processing, thereby to execute the selected processing, or set the frequency of the processing of the normal access or read/write and the data reconstruction, or the amount of the data reconstruction within a unit time.

When the failure occurs in the above memory, the redundancy of the memory, the elapsed time during the data reconstruction, and the state of the normal access or read/write processing and the like are discriminated, and the data reconstruction processing (method) suitable therefor is selected. Therefore, it is possible to prevent reduction of the performance of the processing of the normal access or read/write and ensure the high reliability of the memory. More specifically, in the case where the number of storage units at fault is less than the redundancy of the memory, there is selected the data reconstruction processing (method) in which the processing of the normal access or read/write is given preference, and the faulty data is reconstructed within the remaining period of time. Therefore, no load is put on the processing of the normal access or read/write. On the other hand, in the case where there is no remaining redundancy, since the processing of reconstructing faulty data is given preference, it is possible to ensure the reliability for the failure of the memory. Moreover, in the case where there is some remaining redundancy, since the data reconstruction processing (method) is changed according to the magnitude of the time taken to repair the failure with respect to the storage units in which the failure occurred, it is possible to prevent reduction of the performance of the processing of the normal access or read/write and limit the time required for the data reconstruction within a fixed period of time. Moreover, a time zone, e.g., night, having less processing of the normal access or read/write is selected so that the system can devote itself to the data reconstruction. As a result, it is possible to reduce the load of the memory in a time zone having much processing of the normal access or read/write. Moreover, since the frequency of the data reconstruction processing, or the amount of data reconstruction within a unit time, is set according to the magnitude of the frequency of the processing of the normal access or read/write, it is possible to carry out the data reconstruction processing effectively in a time aspect.

BRIEF DESCRIPTION OF THE DRAWINGS

FIG. 2 is a block diagram showing the arrangement of a memory according to the present invention;

FIG. 3 is a diagram showing the arrangement of a data reconstructing table for a disc at fault of the present invention;

FIG. 7 is still another flow chart of a block of selecting the data reconstruction processing in FIG. 4;

FIG. 8 is yet another flow chart of a block of selecting the data reconstruction processing in FIG. 4; and FIG. 9 is a further flow chart of a block of selecting the data reconstruction processing in FIG. 4.

DESCRIPTION OF THE PREFERRED EMBODIMENTS

Figure 1:
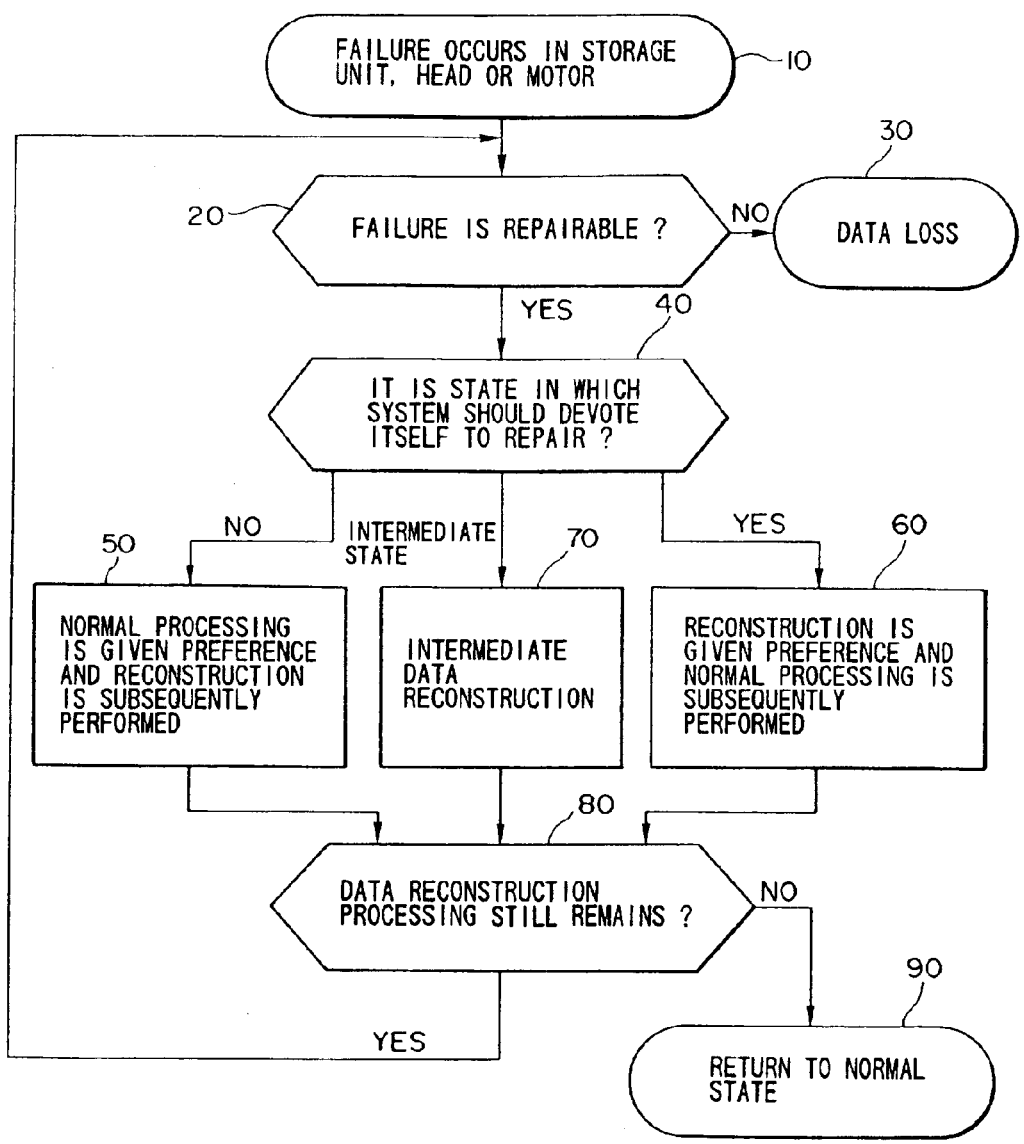
FIG. 1 is a flow chart of the processing of reconstructing faulty data according to the present invention.

The description will hereinafter be given to a flow chart showing the processing of reconstructing faulty data of FIG. 1.

It is assumed that a failure occurs in a memory or a motor (Step 10). In this connection, this failure is detected by the check of an error check code or by the check of the deviation of a motor driving voltage from a predetermined range. First, it is judged whether or not the failure thus occurred is repairable (Step 20). If not, then the data reconstruction processing is completed. This results in data loss (Step 30). If so, it is judged on the basis of the redundancy of the memory, the elapsed time of the data reconstruction and the processing state of the processing of the normal access or read/write whether or not it is a state in which the system should devote itself to the data reconstruction (Step 40). If a request to process the normal processing such as access or read/write is issued from a host unit under the condition in which there is a sufficient remaining redundancy and the urgency of the reconstruction is low, the data reconstruction processing is stopped and the normal processing such as access or read/write is given preference. Then, the data reconstruction processing is performed within the remaining period of time, and the processing of access or read/write during the data reconstruction is cancelled or queued (Step 50). Conversely, if there is no remaining redundancy and the urgency of the reconstruction is high, the data reconstruction processing is given preference, and all of the normal processing such as access or read/write is cancelled or queued (Step 60). Moreover, in the case of the intermediate state in which there are some combinations between the urgency of the data reconstruction and the significance of the normal processing such as access or read/write, the data reconstruction processing corresponding to the individual conditions is previously prepared in the form of programs. Then, when the conditions are changed, a suitable processing can be performed by replacing an old program with a new one (Step 70). Next, when the data reconstruction processing is completed or interrupted, it is checked whether or not the data reconstruction processing still remains (Step 80). After all of the data reconstruction processing has been completed, the memory returns to the normal state (Step 90). If the data reconstruction processing still remains, the flow returns to Step 20 and the above steps will be repeated until the data reconstruction is completed.

Next, a block diagram showing the arrangement of an embodiment of the present invention will be described with reference to FIG. 2.

In FIG. 2, the reference numeral 150 designates an I/O-reconstruction control circuit which receives a command relating to an I/O operation issued from the host unit to carry out the processing according to the command or respond to the host unit. Further, when a failure has occurred in any of the storage units, the circuit 150 serves to select a suitable data reconstruction method on the basis of the number of discs during the reconstruction, the time taken to reconstruct the faulty data, the frequency of the data reconstruction, or the amount of the data reconstruction within a unit time, and the like. There is connected to the individual storage units a monitor 155 which monitors whether after the power source for driving the storage units is activated, the driving voltage is in a predetermined range, and feeds a pseudo-instruction for reading out data previously stored in a predetermined location to the storage units which are entering the running state and monitors the responses sent therefrom. The reference numeral 154 designates a data reconstructing table for the storage unit at fault of which details will be described below with respect to FIG. 3. The reference numeral 152 designates a clock or timer for obtaining the point of failure by giving the time of day and obtaining the elapsed time during the reconstruction and the unit time by a certain method. Then, the data reconstruction method can be changed based on the time measured by the timer as one condition. The reference numeral 156 designates a circuit for reconstructing faulty data which performs the discovery of the faulty data, the data reconstruction and the writing of the data to a spare storage disc. Moreover, the circuit 156 reads out the data from all of the discs except the disc at fault, reconstructs the faulty data using the data thus read out, and transfers the reconstructed data to the host unit and writes it to the spare storage disc. The reference numerals 158, 160, 162, 164, 166, and 168 designate a group of data discs for storing therein the divided data. Although six data discs are shown in FIG. 2, the number thereof is generally arbitrary. The reference numerals 170 and 172 designate discs which store therein ECC data corresponding to the divided data which is stored in the six data discs 158, 160, 162, 164, 166, and 168. When the failure occurs, the faulty data is reconstructed using the ECC data and the normal data among the divided data stored in the six data discs 158, 160, 162, 164, 166, and 168. In this connection, the redundancy of the memory corresponds to the number of ECC discs with respect to the number of discs up to a certain number. But, in the case where more than a certain number of the discs break down, it is impossible to reconstruct the faulty data. This results in data loss. FIG. 2 shows that when the number of ECC discs is two, when two data discs break down, the faulty data can be reconstructed. However, since there is generally known an ECC production method which can compensate for the failure of two or more discs, the number of faulty discs which does not result in data loss, i.e., the redundancy, can be increased. The ECC production is concretely realized using the Reed-Solomon code. The Reed-Solomon code and the error correction method employing the same themselves are well known. The reference numerals 174 and 176 designate spare storage discs for storing therein the reconstructed data. Then, in the case where the storage contents of the faulty disc are stored in a spare storage disc, that spare storage disc is accessed with the data stored therein after the next time. The number of spare storage discs is generally arbitrary.

The data reconstructing table for the disc at fault will now be described with reference to FIG. 3.

The data reconstructing table 154 includes the identification number of the spare storage disc (1), the identification number of the disc at fault (2), the point of failure (3), the sector or address of the failure (4), and the flag used to judge whether or not the failure is repairable (5).

Figure 4:
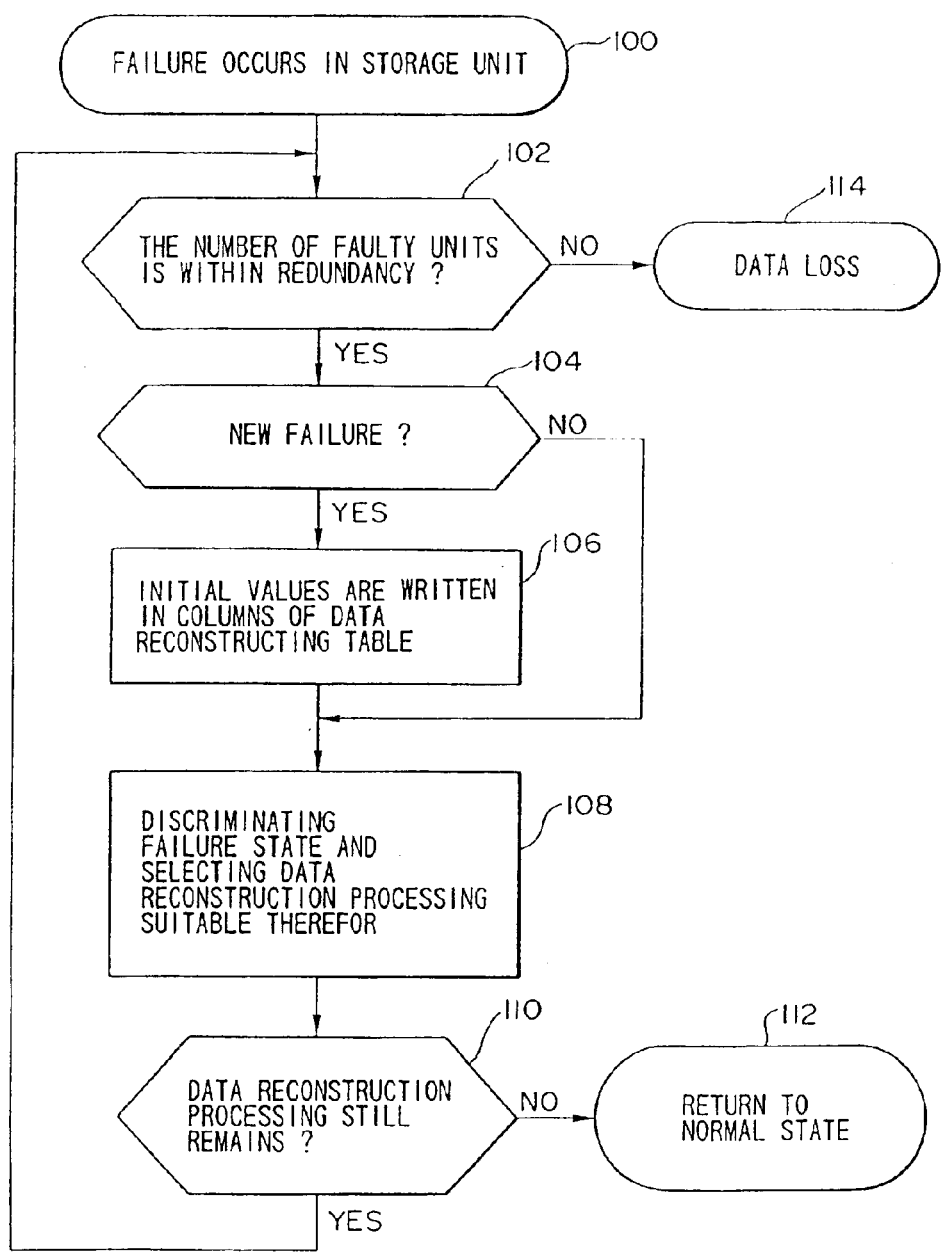
FIG. 4 is a flow chart showing the processing employed in the memory of FIG. 2.

Next, the operations of the memory of FIG. 2 and the table of FIG. 3 will be described on the basis of a flow chart shown in FIG. 4.

First, in FIG. 2, it is assumed that the failure occurs in the data disc 162 (Step 100). Then, the circuit 156 for reconstructing faulty data detects that failure and informs the I/O-reconstruction control circuit 150 of that failure. After receiving that information from the circuit 156, the circuit 150 checks whether or not an unoccupied space is present in the data reconstructing table 154 by referring to the table 154 (Step 102). Subsequently, the circuit 150 checks whether or not that failure is a failure which occurred in a new disc (Step 104). If so, the circuit 150 instructs the circuit 156 to write the following initial values in the columns of interest in the data reconstructing table 154 of FIG. 3. That is, the circuit 156 writes the identification number SPARE 1 of the spare disc 174 in the column of the spare storage unit in the data reconstructing table 154, and writes the identification number #2 of the data disc 162 at fault in the column of the storage unit at fault. Next, the circuit 156 writes the point of failure read out from the timer 152 in the column of the point of failure, and writes the failure occurrence address in the faulty disc 162 in the column of the sector or address of the failure. Finally, the circuit 156 initializes the reconstruction judgment flag of each address (Step 106). If that failure is not a new one, the processing of Step 106 is not executed, but the processing proceeds to the subsequent step. In the subsequent step, the circuit 150 discriminates the state of the failure, selects either the processing of the normal access or read/write, or the data reconstruction processing which is suitable for the state of the failure, and executes the selected processing (Step 108). The details of this Step 108 will be described below with reference to FIG. 5 to FIG. 9. Next, when the data reconstruction processing is completed or interrupted, it is checked whether or not the data reconstruction processing still remains (Step 110). When all of the data reconstruction processing is completed, the memory returns to the normal state (Step 112). When the data reconstruction processing still remains, the processing returns to Step 102, and the above steps are repeated until all of the data reconstruction processing is completed. When any data reconstruction method is chosen, the circuit 156 monitors the continuation or completion of the data reconstruction processing. In the case where a subsequent failure occurs when the data reconstruction of interest has not yet been completed, the circuit 156 starts performing the processing in the same manner as described above (Step 102). Then, in the case where the number of faulty discs for which data reconstruction is not completed exceeds the redundancy of the memory, since the data reconstruction is impossible, the circuit 150 informs the host unit of a data loss (Step 114). If the data reconstruction processing is completed, the unnecessary data in the data reconstructing table 154 is erased and the memory returns to the normal state (Step 112). The address in the table 154 may be in track units, sector units, word units, or any other units.

Next, Step 108 of FIG. 4 will be described with reference to FIG. 5.

Figure 5:
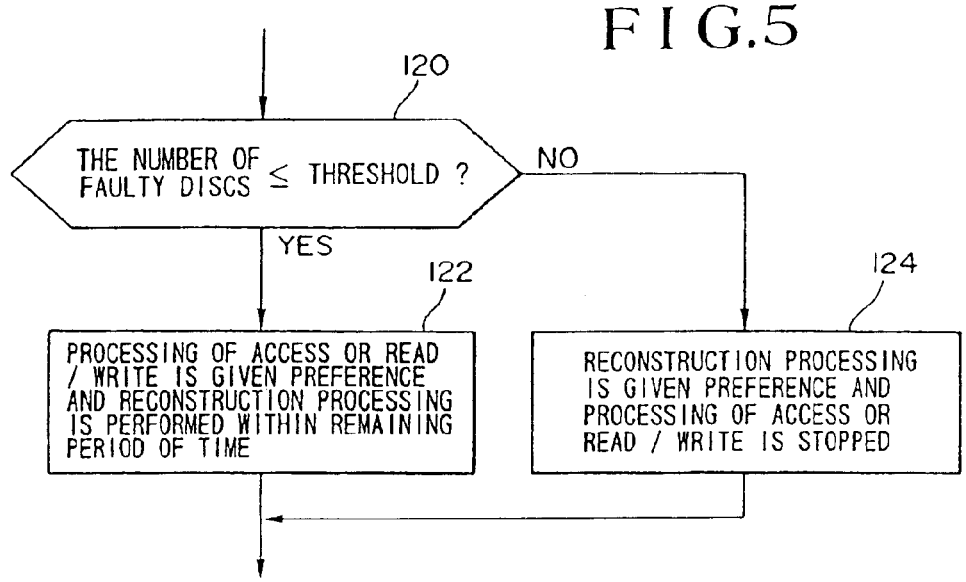
FIG. 5 is a flow chart of a block of selecting the data reconstruction processing in FIG. 4.

In FIG. 5, the I/O-reconstruction control circuit 150 counts the number of discs for which data reconstruction has not been completed by referring to the data reconstructing table 154, and compares the number of faulty discs with a threshold (Step 120). If the number of faulty discs is less than or equal to the threshold which is previously set to a value less than or equal to the redundancy, the circuit 150 judges that there is some remaining redundancy, gives the processing of access or read/write preference, and performs the processing of reconstructing faulty data within the remaining period of time. All of the processing such as access or read/write during the reconstruction waits, i.e., it is cancelled or queued (Step 122). On the other hand, if the number of faulty discs is more than the threshold, the circuit 150 judges that there is no remaining redundancy, gives the data reconstruction processing preference, and cancels or queues all of the normal processing such as access or read/write (Step 124).

The reconstruction is performed on the basis of a unit, such as 1 track, in which the repair and the storage are completed in a relatively short period of time. After the completion of the reconstruction, the memory is opened for the normal processing. But, when the instruction of the processing of access or read/write is issued from the host unit during the reconstruction, the data reconstruction work is stopped immediately, and then the memory is opened for the processing of access or read/write. In the case where during the processing of access or read/write, data which has not yet been reconstructed is read out, the faulty data is then reconstructed using the ECC data and the normal data which was used when producing the ECC data, and the reconstructed data is sent to the host unit. At the same time, the reconstructed data is stored in the spare disc and the reconstruction judgment flag of the address column of interest in the data reconstructing table 154 is set to indicate completion of the reconstruction. If this flag is set to indicate completion of the reconstruction, the subsequent access to this data is performed with the spare disc. In the case of writing data, after the ECC data has been produced, the data which would normally be stored in the faulty disc is stored in the spare disc, and then the reconstruction judgment flag is set to indicate completion of the reconstruction.

Since in the example of FIG. 2, the redundancy is two, it is proper that the threshold is necessarily set to 1. However, in the case where the Reed-Solomon code capable of correcting errors in two or more discs is used, the threshold may be an arbitrary integer number less than or equal to the redundancy. Those values are previously set in the table 157.

Since the I/O-reconstruction control circuit 150 stores the address of the last data which was reconstructed, the data reconstruction is continued from the subsequent address. In the reconstruction, the address of the last data which was reconstructed and previously stored is used. Then, when the flag is not set in the data reconstructing table 154, thus indicating that the data reconstruction is not completed with respect to the subsequent address, the data at that address is reconstructed. The reconstruction of the data is performed in such a way that the ECC data and the normal data which was used to produce the ECC data from the normal discs are read out and the circuit 156 for reconstructing faulty data is used. The reconstructed data is written in the spare disc and the flag in the data reconstructing table 154 is set to indicate completion of the data reconstruction. Then, the reconstructed data in the spare disc can be accessed. The address of the reconstructed data is stored in the circuit 156, and the processing by the circuit 150 proceeds to the subsequent data reconstruction processing.

In the embodiment of FIG. 5, when the number of faulty discs is less than or equal to the threshold, the processing of the normal access or read/write takes precedence over the data reconstruction. Therefore, it is possible to reduce degradation of the performance of access or read/write of the memory. Moreover, since in a state in which the system devotes itself to the data reconstruction, the reconstruction can be performed in a short period of time, it is possible to maintain the reliability of the memory.

In the above embodiments, the data reconstruction method is selected by paying attention to only the number of faulty discs. However, the elapsed time taken to reconstruct the faulty data can, in addition to the number of faulty discs, be included in the conditions.

Next, another example of Step 108 of FIG. 4 will be described with reference to FIG. 6.

Figure 6:
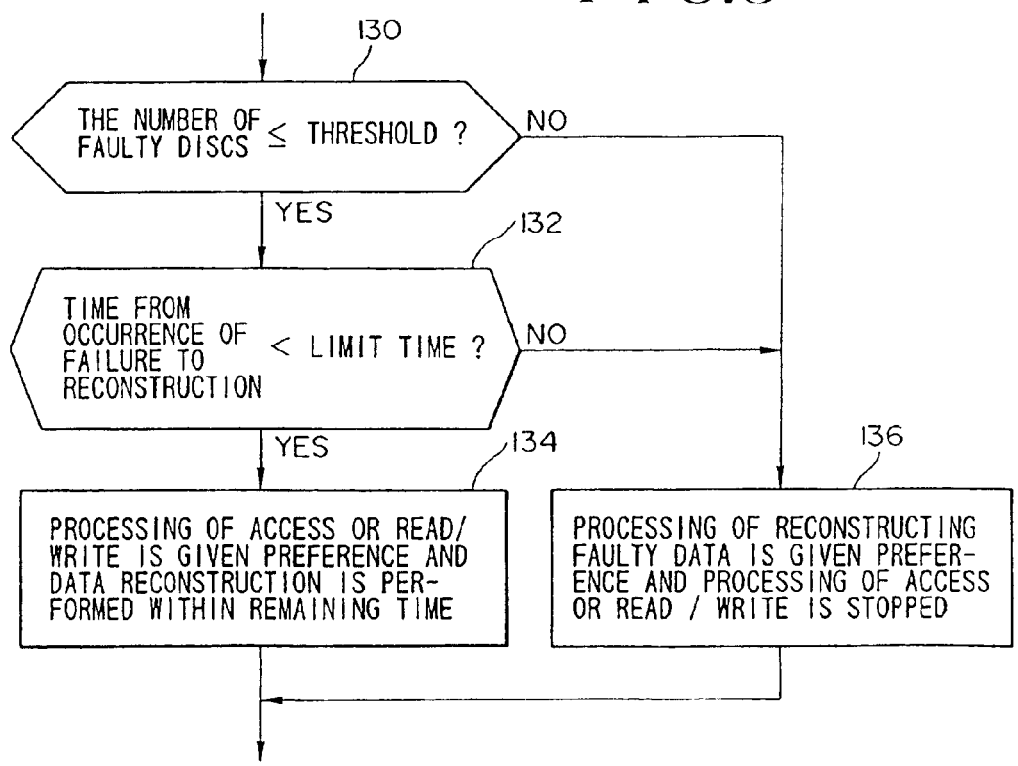
FIG. 6 is another flow chart of a block of selecting the data reconstruction processing in FIG. 4.

In FIG. 6, the I/O-reconstruction control circuit 150 counts the number of discs for which reconstruction is not yet completed by referring to the data reconstructing table 154, and compares the number of faulty discs with a threshold (Step 130). If that number is less than or equal to the threshold, then the circuit 150 reads the present time from the timer 152, and compares the time taken to reconstruct the faulty data, which can be calculated from the present time and the point of failure in the data reconstructing table 154, with a predetermined limit time (Step 132). Then, if the reconstruction time is less than the predetermined limit time, it is considered that the data reconstruction can be deferred. Therefore, the circuit 150 instructs the circuit 156 for reconstructing faulty data to give the processing of the normal access or read/write preference, reconstruct the data in the faulty discs within the remaining period of time, and store the reconstructed data in the spare disc. The request to perform the processing of access or read/write issued from the host unit during the reconstruction is cancelled or queued (Step 134). If the number of faulty discs is more than the threshold, or the reconstruction time is more than the predetermined limit time, it is considered that the data reconstruction cannot be deferred. Therefore, the circuit 150 cancels or queues the command of the normal access or read/write issued from the host unit and instructs the circuit 156 to give the data reconstruction preference (Step 136).

In the embodiment of FIG. 6, when the time taken to reconstruct the faulty data exceeds the limit time, the system devotes itself to the processing of reconstructing faulty data. Therefore, it is possible to limit the reconstruction time within a fixed period of time and improve the reliability of the memory.

Next, another example of Step 108 of FIG. 4 will be described with reference to FIG. 7.

In FIG. 7, the I/O-reconstruction control circuit 150 obtains the present time from the timer 152 and judges whether or not that time is in a time zone having much processing of the normal access or read/write (Step 140). If not, the circuit 150 cancels or queues the command of the normal access or read/write issued from the host unit, and instructs the circuit 156 for reconstructing faulty data to give the data reconstruction preference. Moreover, even if that time is in a time zone having much processing of the normal access or read/write, when the number of faulty discs of Step 142 exceeds the threshold, similarly, the data reconstruction processing is given preference (Step 146). Only when that time is in a time zone having much processing of the normal access or read/write and the number of faulty discs is less than or equal to the threshold, is the processing of the normal access or read/write given preference and the data reconstruction performed within the remaining period of time (Step 144).

In the embodiment of FIG. 7, when it is previously known that the method of using the memory depends on the time zone, the data reconstruction processing can be assigned to the time zone having less processing of access or read/write. Therefore, the data reconstruction processing can be smoothly carried out without the processing of access or read/write hindering the data reconstruction processing.

In the above-mentioned examples of FIG. 5 to FIG. 7, there are provided two kinds of data reconstruction processing in which the reconstruction or the processing of access or read/write is given preference. However, the kind of data reconstruction processing may be increased in correspondence to the circumstances.

Next, another example of Step 108 of FIG. 4 will be described with reference to FIG. 8.

In FIG. 8, when the number of faulty discs exceeds the threshold in Step 180, the data reconstruction processing is given preference and the processing of the normal access or read/write is stopped (Step 188). When the number of faulty discs is less than or equal to the threshold, and the time is not in the time zone having much processing of the normal access or read/write in Step 182, only the read processing is performed and the data reconstruction processing is given preference for the remaining period of time (Step 186). When the number of faulty discs is less than or equal to the threshold and the time is in the time zone having much processing of the normal access or read/write, the processing of the normal access or read/write is given preference and the data reconstruction processing is performed within the remaining period of time (Step 184).

In the embodiment of FIG. 8, when the number of faulty discs is less than or equal to the threshold, but the time is in the time zone having less processing of the normal access or read/write, especially, the time zone having only the read processing, the read processing is preferentially allowed to be performed, whereby it is possible to reduce degradation of the performance of the memory without hindering the data reconstruction processing.

Next, another example of Step 108 of FIG. 4 will be described with reference to FIG. 9.

In FIG. 9, when the number of faulty discs exceeds the threshold in Step 190, or the number of faulty discs is less than or equal to the threshold in Step 190 and the time taken to reconstruct the faulty data exceeds the limit time in Step 192, the data reconstruction processing is given preference and the processing of the normal access or read/write is stopped (Step 202). When the number of faulty discs is less than or equal to the threshold and the time taken to reconstruct the faulty data is less than the limit time, the I/O-reconstruction control circuit 150 reads a unit time from the timer 152, and compares the frequency of the processing of the normal access or read/write within that unit time with a predetermined threshold (Step 194). When the frequency of the processing of the normal access or read/write is more than the threshold, it is considered that the data reconstruction can be deferred. Therefore, the processing of the normal access or read/write is given preference and the data reconstruction processing is performed within the remaining period of time (Step 196). On the other hand, when the frequency of the processing of the normal access or read/write is less than the threshold, the frequency thereof may have any magnitude near or far from the threshold, and thus the frequency changes in magnitude. Therefore, the frequency of the data reconstruction processing or the amount of the data reconstruction within the unit time is dynamically set according to the magnitude of the frequency of the processing of the normal access or read/write (Step 198). Then, the data reconstruction processing is carried out according to the frequency of the data reconstruction processing or the amount of the data reconstruction within the unit time thus set (Step 200).

In the embodiment of FIG. 9, the frequency of the data reconstruction processing or the amount of the data reconstruction within the unit time is set according to the magnitude of the frequency of the processing of the normal access or read/write. Therefore, the data reconstruction processing can be carried out effectively in a time aspect.

Although a magnetic disc is used as the storage unit in the above-mentioned embodiments, the present invention is not limited thereto or thereby. That is, alternatively, an optical disc, a floppy disc, or a semiconductor memory may be used as the storage unit.

Moreover, as the conditions for selecting the data reconstruction method, instead of the above embodiments, the job contents of the host unit, the significance of the file in the memory, and the like may be used as the conditions. The combination of those conditions and the data reconstruction method allows the flexible data reconstruction processing to be performed.

According to the above embodiments, when the number of storage units at fault is less than the redundancy of the memory, the processing of access or read/write takes precedence over the data reconstruction processing. Therefore, the load of the memory is not increased so that it is possible to reduce degradation of the response performance of the memory in the processing of access or read/write to the utmost. Moreover, since when the remaining redundancy becomes small, the processing of access or read/write is automatically stopped and the data reconstruction processing is given preference, the reliability of the memory is not reduced. Further, since the data reconstruction processing method is changed according to the time taken to reconstruct the faulty data of the storage units at fault, it is possible to realize a memory of higher reliability. Moreover, since the frequency of the data reconstruction processing or the amount of the data reconstruction within the unit time is set according to the magnitude of the frequency of the processing of access or read/write, it is possible to carry out the data reconstruction processing effectively in a time aspect.

What is claimed is:

1. A storage system connectable to a computer comprising:
   a plurality of disk units; and
   a controller connected to the plurality of disk units,
   wherein the disk units store data in a plurality of data groups and error correcting data corresponding to each of the data groups,
   wherein the controller performs processing of reconstructing data stored in any of the disk units in which a fault has occurred based on all other data belonging to any of the data groups to which the data to be reconstructed belongs and errors correcting data corresponding to any of the data groups to which the data to be reconstructed belongs, and performs processing of a data read/write request from the computer when a fault has occurred in any of the disk units,
   wherein the controller has a plurality of data reconstructing modes including a first mode wherein a frequency of processing of accesses or data read/write requests is more than a threshold, and a second mode wherein a frequency of processing of accesses or data read/write requests is less than the threshold.

2. A storage system according to claim 1, wherein, in said second mode when the frequency of processing of accesses or data read/write requests within a unit time in the disk units is higher than the frequency of the processing of reconstructing data within the unit time in the units, the controller determines one of the data reconstructing modes to be performed based on a plurality of levels of urgency of data reconstruction.

3. A storage system according to claim 2, wherein, in said first mode when the frequency of the processing of reconstructing data within the unit time in the disk units is higher than the frequency of processing of accesses or data read/write requests within the unit time in said plurality of disk units, the controller executes the processing of the data read/write request prior to the processing of reconstructing data.

4. A storage system according to claim 3, wherein, in said second mode, the controller executes the processing of reconstructing data prior to the processing of accesses or data read/write requests.

5. A storage system according to claim 1, wherein the controller changes one of the data reconstructing modes which is performed by the storage system into another area of data reconstructing modes.

6. A storage system according to claim 1, wherein in said second mode, said controller sets the frequency of processing of accesses or data read/write requests and processing of reconstructing data, or a ratio of the amount of the processings, thereby setting an amount of processing of data reconstruction.

* * * * *